United States Patent [19] [11] 4,376,295
Uenosono et al. [45] Mar. 8, 1983

[54] SYSTEM FOR PREDICTING DESYNCHRONIZATION OF A SYNCHRONOUS MACHINE

[75] Inventors: Chikasa Uenosono; Takao Okada; Junya Matsuki, all of Kyoto; Tadashi Naito; Shinichiro Inoue, both of Kawasaki; Yoshizo Obata, No. 236, Tanabe Higashino-cho 3-chome, Higashi-Sumiyoshi-ku, Osaka-shi, Osaka-fu, all of Japan

[73] Assignees: Fuji Electric Co. Ltd.; Yoshizo Obata, both of Kanagawa, Japan

[21] Appl. No.: 358,471

[22] Filed: Mar. 15, 1982

Related U.S. Application Data

[63] Continuation of Ser. No. 123,963, Feb. 25, 1980, abandoned.

[30] Foreign Application Priority Data

Feb. 27, 1979 [JP] Japan .................................. 54-2143

[51] Int. Cl.³ ............................................. H02H 7/06
[52] U.S. Cl. ...................................... 361/21; 322/24; 322/19; 322/28; 361/20; 361/113
[58] Field of Search ................... 361/21, 20, 23, 113, 361/33, 86, 88, 89, 238, 240, 242, 243; 322/17, 19, 20, 24, 25, 29, 59, 68, 73, 28; 324/158 MG

[56] References Cited

U.S. PATENT DOCUMENTS

| | | | |
|---|---|---|---|
| 2,232,257 | 2/1941 | Myles | 361/113 X |
| 3,515,943 | 6/1970 | Warrington | 361/113 |
| 3,621,369 | 11/1971 | Nagae et al. | 322/24 X |
| 3,970,897 | 7/1976 | Tamir et al. | 361/23 |
| 4,136,312 | 1/1979 | Salon | 324/158 MG X |
| 4,329,637 | 5/1982 | Kotake et al. | 322/25 X |

FOREIGN PATENT DOCUMENTS 1488963 4/1969 Fed. Rep. of Germany ...... 324/158 MG

Primary Examiner—Patrick R. Salce
Attorney, Agent, or Firm—Murray Schaffer

[57] ABSTRACT

There is disclosed a system for predicting desynchronization of a synchronous machine by detecting a phenomenon of radical variation of the magnetic flux in the gap of a synchronous machine immediately before falling in an asynchronous state. For example, a functional value of the fundamental harmonic component and that of the higher harmonic component of the flux in the gap are detected for comparing the variation of each functional value with a predetermined reference level to predict desynchronization of the synchronous machine.

3 Claims, 5 Drawing Figures ns.
SYSTEM FOR PREDICTING DESYNCHRONIZATION OF A SYNCHRONOUS MACHINE This is a continuation application of Ser. No. 123,963, filed Feb. 25, 1980; now abandoned.

BACKGROUND OF THE INVENTION

The invention relates to a system for predicting desynchronization of the synchronous machine, wherein desynchronization is predicted by detecting a dangerous state of the synchronous machine which is apt to move into an asynchronous state.

When the synchronous machine connected to an electric power system falls into an asynchronous (step out) state, the whole system is liable to fall into an asynchronous state. Accordingly, when the synchronous machine is subjected to a dangerous desynchronization, some convenient arrangements such as a field control or a separation of the synchronous machine from the system are required to prevent the system from falling into an asynchronous state.

Hitherto, there is known a desynchronization detecting system for the synchronous machine which comprises a combination of power relays and impedance relays as shown in FIG. 1 which is so arranged that when a resistance component R is represented by the abscissas and a reactance component X is represented by the ordinates, a power relay $W_1$ operates in the region as hatched in FIG. 1 with a boundary of the straight line which is parallel with an axis of the abscissas and passes on the predetermined point "a" on a R-axis, a power relay $W_2$ operates in the region as hatched in FIG. 1 with the boundary of the straight line which is parallel with the axis of abscissas and passes on the predetermined point "-a" on the R-axis and an impedance relay Z operates in the region interior of a circle with a radius of a predetermined impedance $Z(=\sqrt{r^2+x^2}$, wherein r is a resistance and x is a reactance). When the synchronous machine moves into an asynchronous state so that an equivalent impedance viewed from an installation point of the relays shifts tracing the locus of a curve "Z" from the point $Z_0$ of the normal operation, the related operations of the power relays $W_1$, $W_2$ and the impedance relay Z commence to operate a desynchronization detecting sequency circuit (not shown) for detection of the desynchronous state.

The conventional system, however, detects the desynchronization merely after the desynchronization of the synchronous machine and has no function to predict desynchronization when the machine resides in the dangerous state of desynchronization.

Another conventional system with a function of predicting desynchronization is a desynchronization predicting system comprising stability limit control relays. This conventional system when to be applied, for example, to a synchronous generator includes a stability limit control relay "G" which actuates in the hatched region with the boundary of the curve "g" as shown in FIG. 2 wherein an axis of abscissas represents an active power P, an axis of ordinates represents a reactive power Q, a curve L represents an output limit curve of the synchronous generator and a curve "m" represents a steady-state stability limit curve and when the vector coordinates $\dot{W}(=P+jQ)$ of an output of the synchronous generator shifts tracing a locus of the curve "s" from the normal operation point $\dot{W}_o$ over the stability limit curve "g" into the asynchronous region, the stability limit control relay G works to increase an excitation of the synchronous generator so as to withdraw the output vector coordinates $\dot{W}$ to the normal position for prevention of the machine from shifting into the asynchronous state.

However, either the desynchronization predicting system with the stability limit control relay or the desynchronization detecting system with the power relays and the impedance relay in combination utilizes as an input for detection, the external electric values such as a voltage across terminals, an output current, an impedance, an output, a reactive power, a phase angle and the like of the synchronous machine but is not responsive to an abnormal condition of the physical values in the synchronous machine so that it is doubtful whether the detected results represent the real position of the synchronous machine.

SUMMARY OF THE INVENTION

The inventors have discovered after intensive consideration and research that before shifting into desynchronization of the synchronous machine as shown in FIG. 3, the fundamental harmonic component $\phi_1$ of the flux in the gap is decreased abruptly whereas the higher harmonic components $\phi_k$ (where k=2, 3, 4 . . . ) [the third higher harmonic component in FIG. 3] of the flux in the gap is increased radically so that desynchronization may be predicted by detecting the functional values of the fundamental and higher harmonic components.

Accordingly, a general object of the invention is to provide a system for predicting desynchronization of the synchronous machine which may positively predict a dangerous state where the synchronous machine is shifting into desynchronization.

A principal object of the invention is to provide a system for predicting desynchronization of the synchronous machine, characterized by detecting the functional values of the fundamental and higher harmonic components in the gap of the synchronous machine.

Another object of the invention is to provide a system for predicting desynchronization of the synchronous machine, wherein a decrement of the ratio $\phi_1/\phi_k$ of the fundamental harmonic component $\phi_1$ with the higher harmonic component $\phi_k$ below a predetermined reference level is detected to predict the desynchronization of the synchronous machine.

Alternatively, the desynchronization of the synchronous machine may be predicted by detecting a decrement of the fundamental harmonic component $\phi_1$ of the flux in the gap below a predetermined reference level or an increment of the higher harmonic component $\phi_k$ of the flux in the gap over a predetermined reference level.

Further, the desynchronization of the synchronous machine may be predicted by detecting an increment of the decreasing rate ($-d\phi_1/dt$) of the fundamental harmonic component $\phi_1$ of the flux in the gap over a predetermined reference level or an increment of the increasing rate ($d\phi_k/dt$) of the higher harmonic component $\phi_k$ of the flux in the gap over a predetermined reference level.

Furthermore, the desynchronization of the synchronous machine may be predicted by detecting an increment of the wave form distortion factor $$\gamma = \sqrt{\sum_{k=2,3,\ldots} \phi_k/\phi_1}$$

over a predetermined reference level.

Other objects and advantages of the invention will be further understood by reference to the examples given below and to the drawings, all of which are given for illustrative purpose only and are not limitative, the drawings being:

PREFERRED EMBODIMENTS OF THE INVENTION

Figure 4:
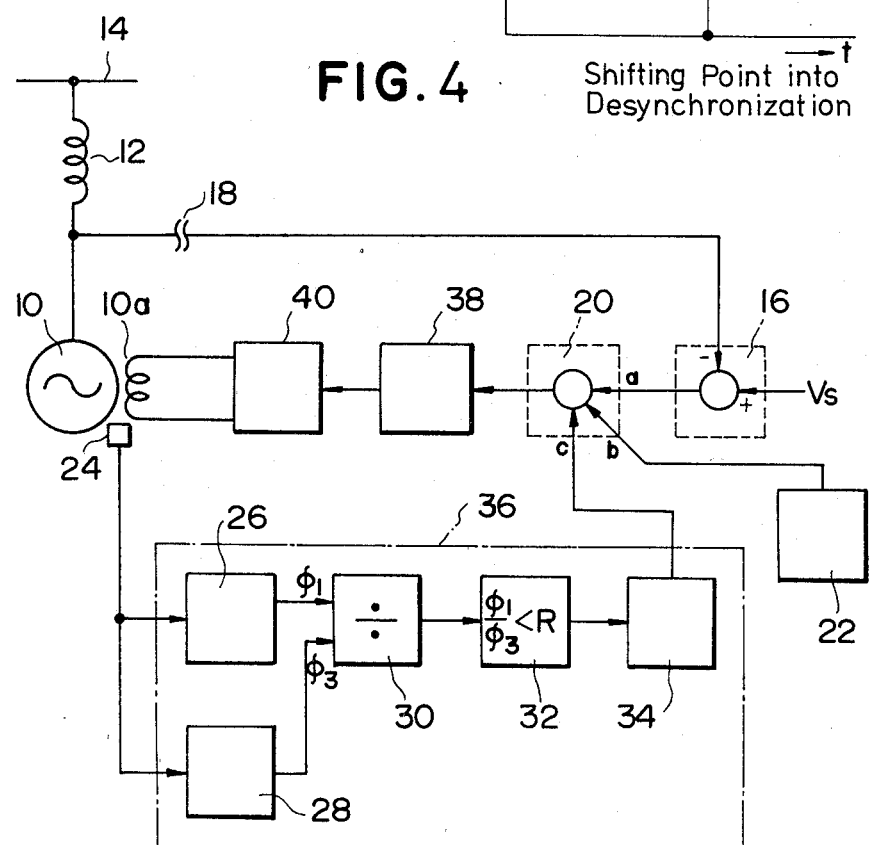
FIG. 4 is a block diagram illustrative of the synchronous generator control circuit of one embodiment of the system for predicting desynchronization of the synchronous machine in accordance with the invention.

In FIG. 4, an armature terminal of a synchronous generator 12 is connected through an impedance 12 to a power system 14. The armature terminal of the synchronous generator 10 is further connected through a voltage transformer 18 to an input terminal of the voltage deviation detector 16 which is in turn connected to a reference voltage source $V_s$ and an output terminal of the voltage deviation detector 16 is connected to an input terminal "a" of an adder 20. An input terminal "b" of the adder 20 is connected to an excitation system auxiliary unit 22 such as a vibration-suppressing-stabilizer.

The synchronous generator 10 is interiorly provided with a gap flux detector 24 which at its output terminal is connected to an input terminal of the desynchronization predicting unit 36 which includes a fundamental harmonic analyzer 26, a third higher harmonic analyzer 28, a divider 30, a signal level comparator 32 and an amplifier 34 and an output terminal of the desynchronization predicting unit 36 is connected to an input terminal "c" of the adder 20.

An output terminal of the adder 20 is connected to an input terminal of an automatic voltage regulator 38 which at its output is in turn connected through an excitation unit 40 to a field winding 10a of the synchronous generator 10.

A typical operation of the circuit thus constructed with the system in accordance with the invention shall be described in the followings.

The generator terminal voltage generated by the synchronous generator 10 is supplied through the voltage transformer 18 to the voltage deviation detector 16 for comparison with the reference voltage $V_s$, then the deviation is fed into the input terminal "a" of the adder 20 whereas an output of the excitation system auxiliay unit 22 is fed into the input terminal "b" of the adder 20 for addition and an output of the adder 20 is supplied into the input terminal of the automatic voltage regulator 38. The automatic voltage regulator 38 supplies the output responding to the input to the excitation unit 40 for feeding to the field winding 10a of the synchronous generator 10 an excitation current by which the terminal voltage of the synchronous generator 10 is maintained in a predetermined reference voltage $V_s$ so that the synchronous generator 10 generates the predetermined voltage for operation in synchronous with the power system 14.

The gap flux $\phi_g$ of the synchronous generator 10 is detected by the gap flux detector 24 installed in the synchronous generator 10 and is fed into the fundamental harmonic analyzer 26 and the third higher harmonic analyzer 28 of the desynchronization predicting unit 36. In the fundamental harmonic analyzer 26 and the third higher harmonic analyzers 28, the fundamantal harmonic component $\phi_1$ and the third higher harmonic component $\phi_3$ of the supplied flux are removed for supply into the divider 30 to produce the ratio $\phi_1/\phi_3$ of the both components and then the resultant arithmetic output is fed into the signal level comparator 32.

Figure 1:
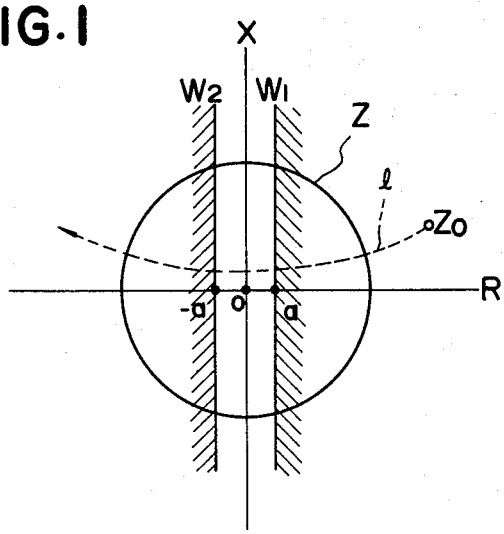
FIG. 1 is a pictorial diagram illustrative of the function of the conventional system for detecting desynchronization of the synchronous machine.
Figure 2:
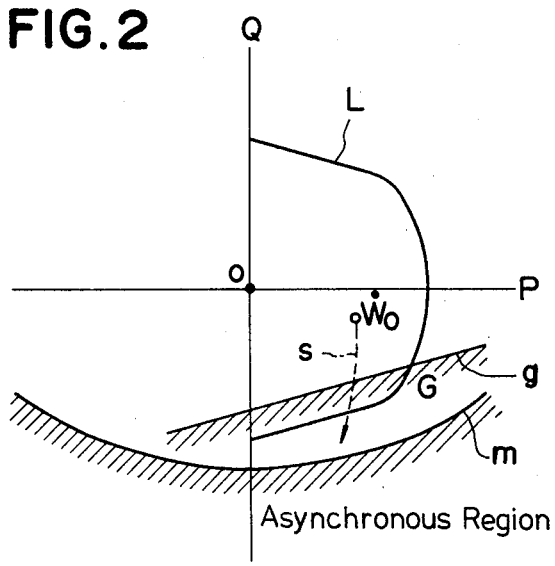
FIG. 2 is pictorial diagram illustrative of the function of the conventional system for predicting desynchronization of the synchronous machine.
Figure 3:
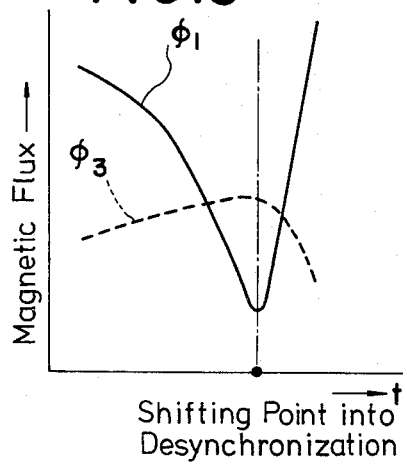
FIG. 3 is a graphical diagram showing the variation of the fundamental and third higher harmonic components of the flux in the gap before and after desynchronization of the synchronous machine.
Figure 5:
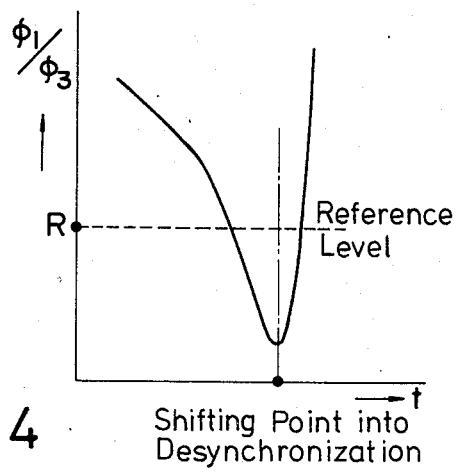
FIG. 5 is a graphical diagram showing a characteristic curve of the variation in the ratio of the fundamental and higher harmonic components of the flux in the gap before and after the desynchronization of the synchronous machine.

The ratio $\phi_1/\phi_3$ of the fundamental harmonic component $\phi_1$ and the third higher harmonic component $\phi_3$ of the flux in the gap in the vicinity of the moment of shifting into desynchronization of the synchronous machine has the characteristics as shown in FIG. 5 and the signal level comparator 32 is arranged to generate an output when the input decreases below the reference level R as shown in FIG. 5. When the synchronous generator 10 is operated in the normal condition or not in the dangerous condition of shifting into desynchronization, the output of the signal level comparator 32 is maintained in zero and, since no input is fed to the input terminal "c" of the adder 20 from the amplifier 34, the synchronous generator is operated without compensation operation of the excitation current.

When the synchronous generator 10 comes to fall into a dangerous condition of desynchronization due to a certain factor so that the ratio $\phi_1/\phi_3$ of the fundamental harmonic component $\phi_1$ and the third harmonic component $\phi_3$ of the flux in the gap decreases below the reference level R as shown in FIG. 5, an output signal which is generated at the output terminal of the signal level comparator 32 to indicate the dangerous condition is amplified by the amplifier 34 for supply to the input terminal "c" of the adder 20 via the output terminal of the desynchronization predicting unit 36. Consequently, the output of the adder 20 is increased so that the automatic voltage regulator 38 enforces energization of the field winding 10a through the excitation unit 40 thereby to prevent the synchronous generator 10 from shifting into the asynchronous state.

In the foregoing embodiment, the desynchronization is predicted by detecting the decrement of the ratio of the fundamental harmonic component and the higher harmonic component of the flux in the gap below a predetermined reference level, notwithstanding the desynchronization may also be predicted by detecting the decrement of the fundamental harmonic component $\phi_1$ of the flux in the gap below a predetermined reference level or the increment of the higher harmonic component of the flux in the gap over a predetermined reference level.

Further, the desynchronization may also be predicted by detecting the increment of the decreasing rate ($-d\phi_1/dt$) of the fundamental harmonic component $\phi_1$ of the flux in the gap over a predetermined reference level or the increment of the increasing rate ($d\phi_k/dt$) of the higher harmonic component $\phi_k$ of the flux in the gap over a predetermined reference level.

Furthermore, the desynchronization may be predicted by detecting the increment of the wave form distortion factor $$\gamma = \sqrt{\sum_{k=2,3,\ldots} \phi_k^2/\phi_1}$$

of the flux in the gap over a predetermined reference level. FIG. 7 shows a control circuit for a synchronous generator of another embodiment according to the invention. In FIG. 7, each unit working similarly to that in FIG. 5 is indicated by the same reference numeral so as to simplify the description.

As distinctly understood, the system according to the invention may be applied to any synchronous machines such as the synchronous motor, the synchronous phase modifier and the like although the foregoing embodiments are conveniently directed to synchronous generators.

Accordingl to the invention, there is provided a system which may positively predict the dangerous condition of desynchronization of the synchronous machine with a remarkable effect to enhance the controlling performance of the synchronous machine.

Further, the system according to the invention may also be applied for measurement of the variation of the condition of the synchronous machine other than the desynchronization.

What is claimed is:

1. A method for predicting and regulating desynchronization of a synchronous machine, in which a voltage detected through a voltage transformer from an armature terminal of the synchronous machine is compared with a reference voltage by a voltage deviation detector and the resulting voltage deviation performs excitation of a field winding through an automatic voltage regulator and an excitation unit, and in which a gap flux detector is installed in the synchronous machine to detect its gap flux from which a functional value of a fundamental harmonic component and/or a higher harmonic component is detected through an analyzer and the resulting functional value of the fundamental harmonic component and/or the higher harmonic component is compared with a predetermined reference level by a signal level comparator for predicting the desynchronization by detecting a shift from the reference level, the resulting detected signal for predicting the desynchronization being added through an amplifier and an adder to the voltage deviation obtained by the voltage deviation detector and then being fed to the automatic voltage regulator for regulating the excitation of the field winding.

2. The method for predicting and regulating desynchronization according to claim 1, wherein the desynchronization is predicted by detecting a decrement of either the fundamental harmonic component $\phi_1$ of the gap flux or the ratio $\phi_1/\phi_k$ of the fundamental harmonic component $\phi_1$ to the higher harmonic component $\phi_k$ ($k=2,3,4\ldots$) of the gap flux below the predetermined reference level.

3. The method for predicting and regulating desynchronization according to claim 1 wherein the desynchronization is predicted by detecting an increment of anyone of the decreasing rate ($-d\phi_1/dt$) of the fundamental harmonic component $\phi_1$, the increasing rate ($d\phi k/dt$) of the higher harmonic component $\phi k$ and the wave form distortion factor of the gap flux over the predetermined reference level.

* * * * *